United States Patent
Appelt et al.

(10) Patent No.: US 6,225,031 B1
(45) Date of Patent: May 1, 2001

(54) PROCESS FOR FILLING APERTURES IN A CIRCUIT BOARD OR CHIP CARRIER

(75) Inventors: Bernd Karl Appelt, Endicott, NY (US); Gary Alan Johansson, New Castle, DE (US); Konstantinos I. Papathomas, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/190,860

(22) Filed: Nov. 9, 1998

(51) Int. Cl.$^7$ ....................................................... G03F 7/40
(52) U.S. Cl. .................... 430/315; 430/313; 430/324; 430/326; 430/330
(58) Field of Search ................................... 430/313, 315, 430/324, 326, 330

(56) References Cited

U.S. PATENT DOCUMENTS

| | | | |
|---|---|---|---|
| 4,414,059 | 11/1983 | Blum et al. ................... | 156/659.1 |
| 4,983,252 | 1/1991 | Masui et al. .................... | 156/630 |
| 5,030,321 | 7/1991 | Coutandin et al. ............... | 156/643 |
| 5,443,672 | 8/1995 | Stoll et al. ..................... | 156/244.17 |
| 6,009,620 | * 1/2000 | Bhatt ............................. | 29/852 |
| 6,022,670 | * 2/2000 | Russell .......................... | 430/315 |
| 6,037,096 | * 3/2000 | Fletcher ......................... | 430/256 |
| 6,066,889 | * 5/2000 | Jones ............................. | 257/698 |
| 6,090,474 | * 7/2000 | Johansson ....................... | 428/209 |

* cited by examiner

*Primary Examiner*—Mark F. Huff
*Assistant Examiner*—Nicole Barreca
(74) *Attorney, Agent, or Firm*—Connolly, Bove, Lodge & Hutz LLP; John R. Pivinichny

(57) ABSTRACT

Apertures in a circuit board or chip carrier are filled with a cured photosensitive dielectric material by substantially filling the apertures in the circuit board or chip carrier and applying a layer of a thickness to the circuit board or chip carrier with a positive photosensitive dielectric material, exposing the photosensitive dielectric material to actinic radiation in such a way as to leave material located in apertures unexposed to the radiation; baking the structure so as to harden the unexposed photosensitive dielectric material and developing the exposed dielectric material in order to remove it leaving behind cured photosensitive dielectric material in the apertures.

32 Claims, No Drawings

PROCESS FOR FILLING APERTURES IN A CIRCUIT BOARD OR CHIP CARRIER

TECHNICAL FIELD

The present invention is concerned with providing an aperture filling layer supported on a carrier film and with filling apertures in a circuit board or chip carrier with dielectric material. The present invention provides particular applicability in filling plated through holes in integrated circuit boards or chip carriers. In addition, the present invention provides for achieving a planar top surface along with the filling of the apertures. This can be accomplished by the present invention without causing dimensional changes or adversely impacting the dimensional stability of the printed circuit board.

BACKGROUND OF INVENTION

Substrates on which an electronic device are electrically mounted are commonly fabricated from dielectric materials such as ceramics, ceramic metal composites, polymeric materials and polymeric material-metal composites. These substrates can have multi-level electrical conductor patterns embedded therein.

In the simplest embodiments, the substrate has one dielectric layer having electrical conductor patterns on both sides thereof which are electrically interconnected by a plurality of electrically conducting apertures or vias extending through the substrate.

In an alternative embodiment, the substrate is fabricated from an electrically and/or thermally conducting layer coated with a dielectric material. A plurality of through-holes are drilled, punched or etched through the substrate. To form an electrically conducting aperture or via which is electrically isolated from the core, the through-holes are typically plated with an electrically conductive layer and then filled at least in the region of the core with an electrically insulating material.

However, the techniques employed for filling the vias require subsequent planarization so as to ensure that the surfaces are planar whereby the dielectric is flush or level with the metallization thereon. However, various of these prior art planarization methods introduce dimensional changes to the printed circuit board or adversely impact its dimensional stability. Planarization is normally done by belt-sanding and/or chemical polishing method which include mechanical deformation or stretching to the printed circuit board. Such dimensional changes affect subsequent circuitization processes.

Accordingly, continuing efforts are underway for providing improved techniques for filling apertures in printed circuit boards.

SUMMARY OF INVENTION

The present invention provides a photosensitive dielectric on a film carrier, and a process for filling apertures in a printed circuit board or chip carrier with such dielectric material that overcomes problems present with current techniques. More particularly, the present invention provides a process for filling apertures in a circuit board or chip carrier with a dielectric material along with the ability to achieve a planar surface that avoids introducing dimensional changes and does not adversely impact the dimensional stability of the printed circuit board or chip carrier.

More particularly, one aspect of the present invention is concerned with a process of filling apertures in a printed circuit board or chip carrier with a cured photosensitive dielectric material which comprises substantially filling the apertures in the circuit board with a positive photosensitive dielectric material and providing a layer having a thickness of the positive photosensitive dielectric material on the circuit board or chip carrier. The photosensitive dielectric material is then exposed to radiation of an intensity and for a duration of time effective for causing the photosensitive dielectric material to be exposed to a depth of substantially the thickness provided on the circuit board or chip carrier but leaving the photosensitive material located in the apertures unexposed. The photosensitive dielectric material is subjected to baking at elevated temperatures in order to cure the unexposed material located in the apertures, and the exposed photosensitive dielectric material is developed and removed thereby leaving behind cured photosensitive dielectric material in the apertures. The baking can occur prior to and/or after the developing of the exposed photoresist. Also, the baking can be such that partial cure occurs prior to the developing with the final cure occurring after developing.

According to a further aspect of the present invention, apertures in a printed circuit board or chip carrier are substantially filled along with providing a layer having a thickness to the printed circuit board with a positive photosensitive dielectric material. The photosensitive dielectric material is selectively exposed to radiation except for photosensitive dielectric material located within the vicinity of apertures thereby leaving photosensitive dielectric material located within apertures unexposed. The photosensitive dielectric material is baked to thereby cure the unexposed portions of the photosensitive dielectric material and the exposed photosensitive dielectric material is developed thereby removing it while leaving behind cured photosensitive dielectric material in apertures. The baking can be carried out prior to and/or after the developing of the exposed photoresist. Also, the baking can be carried out so that partial cure occurs prior to the developing and final cure occurs after the developing.

The present invention also relates to chip carriers and circuit boards with holes filled according to the above processes.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

The present invention relates to filling apertures in a circuit board or chip carrier with a dielectric material. More particularly, the present invention includes filling apertures in a circuit board or chip carrier with a positive photosensitive dielectric material. According to the present invention, this can be accomplished by such techniques as coating, screening or stenciling the desired amount of a flowable positive photosensitive dielectric material to fill the apertures and the surrounding area of the apertures on the surface of the circuit board or chip carrier. The photoresist material employed typically is tack free at normal room temperatures and flowable at temperatures of about 180° C. or lower, and more typically at temperatures of about 50° C. to about 160° C. Moreover, typically the photosensitive dielectric material has viscosity of about 20,000 to about 1,000,000 and more typically about 20,000 to about 500,000 cps.

If aqueous alkaline development is desired, the light sensitive composition according to the invention can contain components for example a polyphenol or a mixture of polyphenols, i.e. a polymer having a specific content of phenolic hydroxyl groups. This content should at least be sufficiently high to ensure development, or at least swelling, in an aqueous alkaline solution of developer.

Suitable film-forming components soluble in aqueous alkaline solutions can be classified in the following groups:
    novolaks formed from at least one phenol and at least one aldehyde,
    homopolymers and copolymers of alkenylphenols and, in particular,
    homopolymers and copolymers of N-hydroxyphenylmaleinimides.

Preferred novolaks are compounds derived from a $C_1$–$C_6$, aldehyde, for example formaldehyde and acetaldehyde, and from a mononuclear, substituted or unsubstituted phenol. Examples of preferred phenols are phenol itself or phenols substituted by one or two $C_1$–$C_9$ alkyl groups, for example o-, m- or p-cresol, xylenol, p-tert-butylphenol and o-, m- or p-nonylphenol, or phenols substituted by one or two halogen atoms, typically chlorine or bromine, for example p-chlorophenol, phenols substituted by a phenyl nucleus, for example p-phenylphenol, or phenols containing more than one phenolic group, for example resorcinol, bis-(4-hydroxyphenyl)-methane or 2,2-bis-(4-hydroxyphenyl)-propane.

Preferred homopolymers or copolymers of alkenylphenols are, in particular the compounds of the formula I

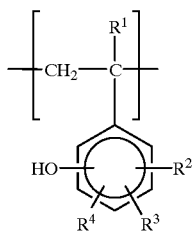

I in which $R^1$ is hydrogen or methyl and $R^2$, $R^3$ and $R^4$ independently of one another are hydrogen, $C_1$–$C_4$ alkyl, $C_1$–$C_4$ alkoxy, halogen, in particular chlorine or bromine, and methylol. The phenolic hydroxyl group is located in the o-, m- or p-position relative to the alkenyl group, but is preferably in the p-position.

Examples of suitable comonomers are vinyl monomers free from carboxyl groups. Examples of such monomers are styrene, acrylic and methacrylic acid esters, in particular methyl (meth)acrylates or 2-hydroxyethyl (meth)acrylates, acrylamide, vinyl acetate and N-substituted maleimides.

The proportion of comonomer is preferably 0–50 mol % relative to the whole of the polymer.

Aqueous alkaline solutions are preferably employed for the development of exposed layers of phenolic type photosensitive compositions. These include, in particular, aqueous solutions of alkali metal silicates, phosphates and hydroxides or tetraalkylammonium compounds. If appropriate, even smaller amounts of wetting agents and/or organic solvents can be added to these solutions.

Typical organic solvents are those which are miscible with water and which can be added to the developer liquids, for example 2-ethoxyethanol or acetone and mixtures of two or more of such solvents.

The light sensitive compositions according to the invention can, if appropriate, also contain sensitizers. The following are examples of these: perylene, 9,10-dichloroanthracene, 9,10-diphenylanthracene, 3,4-benzopyrene, 1-chloroanthracene, 2-methylanthracene, 9-methylanthracene, 2-t-butylanthracene, anthracene, 1,12-benzoperylene, trans-1,3-5-hexatriene, 1,2-benzanthracene, pyrene, pentaphene, diphenyltetraacetylene, transstilbene, 1,2,3,4-dibenzanthracene, 1,2,5,6-dibenzanthracene, 1,3-cyclohexadiene, 1,2,7,8-dibenzanthracene and 1,2-benzopyrene.

Anthracenes, phthalimide tioethers and especially thioxanthones are preferred. These are typically added in an amount of 0.2–10% by weight, preferably 0.5–5% by weight, relative to the resin.

Examples of suitable positive photosensitive materials include compositions based on phenol formaldehyde novolak polymers. A particular example of such is Shipley 1350 which is a m-cresol formaldehyde novolak polymer composition. Such is a positive resist composition and includes therein a diazoketone, such as 2-diazo-1-naphthol-5-sulphonic acid ester. In such a composition, the orthodiazoketone during the photochemical reaction is converted to a carboxylic acid. This, in turn, converts a neutral-organic soluble molecule (the phenolic polymer) to one that is readily soluble in weakly alkali aqueous developer solutions. Other suitable photosensitive materials include copolymers of hydroxystyrene and methacrylates and/or acrylates such as t-butylmethacrylates, poly(hydroxystyrene), poly(hydroxystyrene-co-t-butyloxycarbonyloxystyrene), poly(hydroxystyrene-co-hydroxymethylstyrene), poly(hydroxystyrene-co-acetoxymethylstyrene), alkyl substituted polyvinyl phenols and other novolak resins such as ethylphenol novolaks and xylenol novolaks. Other photosensitive materials include poly(p-tert-butoxycarbonyloxy-A-methylstyrene), poly(p-tert-butoxycarbonyloxystyrene), poly(tert-butyl-p-vinylbenzoate), poly(tert-butyl-p-isopropenylphenyloxyacetate), and poly(tert-butylmethacrylate).

The epoxides that can be used are diepoxides and polyepoxides and epoxide resin prepolymers of the type used for the preparation of crosslinked epoxide resins. The diepoxides and polyepoxides can be aliphatic, cycloaliphatic or aromatic compounds. Examples of such compounds are the glycidyl ethers and β-methylglycidyl ethers of aliphatic or cycloaliphatic diols or polyols, for example those of ethylene glycol, propane-1,2-diol, propane-1,3-diol, butane-1,4-diol, 1,1,2,3,3-pentahydroxycyclohexane, diethylene glycol, polyethylene glycol, polypropylene glycol, glycerol, trimethylolpropane or 1,4-dimethylolcyclohexane or 2,2-bis-(4-hydroxycyclohexyl)-propane, the glycidyl ethers of diphenols and polyphenols, for example resorcinol, 4,4'-dihydroxydiphenylmethane, 4,4'-dihydroxydiphenyl-2,2-propane novolaks and 1,1,2,2-tetrakis-(4-hydroxyphenyl) ethane.

Further glycidyl compounds of importance are the glycidyl esters of carboxylic acids, in particular dicarboxylic and polycarboxylic acids. Examples of these are the glycidyl esters of succinic acid, adipic acid, azelaic acid, sebacic acid, phthalic acid, terephthalic acid, tetrahydrophthalic acid, hexahydrophthalic acid, isophthalic acid or trimellitic acid, or of dimerized fatty acids.

Examples of polyepoxides other than glycidyl compounds are the diepoxides of vinyl cyclohexene and dicyclopentadiene, 3-(3',4'-epoxycyclohexyl)-8,9-epoxy-2,4-dioxaspiro[5.5]undecane, the 3',4'-epoxycyclohexylmethyl ester of 3,4-epoxycyclohexanecarboxylic acid, butadiene diepoxide or isoprenediepoxide, epoxidized linoleic acid derivatives or epoxidized polybutadiene.

Preferred epoxide resins are diglycidyl ethers, which may be of the so-called advanced type, of dihydric phenols or dihydric aliphatic alcohols having 2 to 4 carbon atoms. Epoxy novolaks, the diglycidyl ethers, which may be of the so-called advanced type, of 2,2-bis-(4-hydroxyphenyl)-propane and bis-(4-hydroxyphenyl)-methane and glycidyl ethers of cresol novolaks are particularly preferred.

Amine, urea or imidazole hardeners can be employed in the crosslinking of epoxy resins. Examples of suitable hardeners are imidazole, 1-methylimidazole, 2-methylimidazole, 2-ethyl-4-methylimidazole, 2,4-dimethylimidazole, 2-phenylimidazole, 1-vinyl-2-methylimidazole, 2-chloro-4-(N',N'-dimethylureido)-toluene, 2-(N',N'-dimethylureido)-phenol and 4-(N',N'-dimethylureido)-chlorobenzene.

Among the latent hardeners, imidazole and derivatives thereof are preferred.

The amount of hardener added is known to those skilled in the art and is usually 0.1–10% by weight, preferably 0.5–5% by weight, relative to the resin.

The iron-arene complexes are known compounds and have been described for example in U.S. Pat. No. 5,371,259 as photoinitiators for cationically photopolymerizable materials.

The compositions according to the invention preferably contain 0.5–20% by weight, in particular 1–5% by weight of the photoinitiator relative to the resin.

The compositions according to the invention are distinguished by the fact that the hardenability of exposed areas differs markedly from that of areas not exposed to light. This makes it possible to harden the unexposed areas after heat treatment in such a way that it becomes insoluble in the developer composition.

In addition, the photosensitive compositions can include a photoinitiator and in many cases a cationic initiator. For instance, typical photoinitiators employed are ones which will generate a Bronsted acid upon exposure to actinic light. Examples of such photoinitiators are well known and include onium salts and especially Group VIA and Group VIIA salts such as selenonium, sulfonium and iodonium salts. Various suitable photoinitiators are disclosed in U.S. Pat. Nos. 4,161,478; 4,442,197; 4,139,655; 4,400,541; 4,197,174; 4,173,476; and 4,299,938; and European Patent Application 44/0094914 and 84/0126712, disclosures of which are incorporated herein by reference.

Also see Watt et al, "A Novel Photoinitiator of Cationic Polymerization: Preparation and Characterization of Bis[4-(diphenylsulfonio)phenyl]-sulfide-Bis-hexafluorophosphate", Journal of Polymer Science: Polymer Chemistry Edition, Vol. 22, p. 1789 (1980), John Wiley & Sons, Inc. Additional discussions concerning sulfonium and iodonium salts can be found, for instance, in Crivello et al, "Complex Triaryl Sulfonium Salt Photoinitiators. II. The Preparation of Several New Complex Triaryl Sulfonium Salts and the Influence of their Structure in Photoinitiated Cationic Polymerization", Journal of Polymer Science: Polymer Chemistry Edition, Vol. 18, pp. 2697–2714 (1980), John Wiley & Sons, Inc.; Pappas et al, "Photoinitiation of Cationic Polymerization. III. Photosensitization of Diphenyliodonium and Triphenylsulfonium Salts", Journal of Polymer Science: Polymer Chemistry Edition, Vol. 22, pp. 77–84 (1984), John Wiley & Sons, Inc.; Crivello et al, "Photoinitiated Cationic Polymerization with Triaryl Sulfonium Salts", Journal of Polymer Science: Polymer Chemistry Edition, Vol. 17, pp. 977–999 (1979), John Wiley & Sons, Inc.; Crivello et al, "Complex Triaryl Sulfonium Salt Photoinitiators. I. The Identification, Characterization, and Synthesis of a New Class of Triaryl Sulfonium Salt Photoinitiators", Journal of Polymer Science: Polymer Chemistry Edition, Vol. 1822, pp. 2677–2695 (1980), John Wiley & Sons, Inc.; and Crivello, "Cationic Polymerization—Iodonium and Sulfonium Salt Photoinitiators", Advances in Polymer Science, Series No. 62, pp. 1–48 (1984), Springer-Verlag.

Typical of the onium salts are diaryliodonium and triarylsulfonium salts. These photoacids may include diphenyliodoniumhexafluoroarsenate, di(t-butylphenyl)iodoniumhexafluoroarsenate, diphenyliodoniumhexafluoroantimonate, di(t-butylphenyl)iodoniumhexafluoroantimonate, diphenyliodoniumtriflate, di(t-butylphenyl)iodoniumtriflate, diphenylsulfoniumhexafluoroantimonate, diphenylsulfoniumhexafluoroarsenate, tri(t-bytylphenyl)sulfoniumhexafluoroarsenate, triphenylsulfoniumhexafluorophosphate, tri(t-butylphenyl)sulfoniumhexafluorophosphate, triphenylsulfoniumtriflate and tri(t-butylphenyl)sulfoniumtriflate.

The compositions according to the invention can also contain other additives customary in the art. Examples of these are pigments, dyes, wetting agents, flow-control agents, stabilizers, fillers, thixotropic agents, adhesion promoters, plasticizers and binders.

The photosensitive material can be applied for instance by providing a film of such having a thickness of about 1 to about 3 mils. This can be achieved by coating the photosensitive material to the desired thickness on a supporting substrate such as a Mylar film of about 1 to about 7 mils thick.

The light-sensitive layer can be coated onto a flexible carrier by first preparing a solution or suspension of the composition. The choice of solvent and the concentration depend mainly on the nature of the composition and on the coating process. The solution is applied uniformly to a flexible carrier by known coating processes, for example by wire-coating, dipping, doctor-blade coating, curtain coating processes, brushing, spraying, electrostatic spraying and reverse roll coating.

The coated substrate can then be placed on the circuit board with the photosensitive dielectric material contacting the circuit board and then placed under pressure in order to cause the photosensitive material to flow into the vias or apertures. The laminating pressure employed is typically about 50 to about 700 psi. The lamination also is typically carried out at a temperature of about 80° C. to about 150° C. so that the light sensitive material flows into the apertures. Next, the supporting substrate such as the Mylar can be removed. Remaining on the surface of the circuit board will be the photoresist material typically at a thickness of about 0.5 to about 0.7 mils less than the thickness of the layer of photoresist material prior to the laminating. For example, in the event the thickness of the photoresist material prior to laminating was about 2 mils, then the thickness of it remaining on the substrate will be about 1.3 to about 1.5 mils. Typically, the thickness of the photoresist on the substrate is about 0.1 mil to about 5 mil and more typically about 0.5 to about 2.5 mil.

According to one embodiment of the present invention, the photosensitive dielectric material is exposed to actinic radiation wherein the intensity and duration of the radiation is sufficient to expose the photosensitive dielectric material only to the depth of the thickness while leaving the photosensitive dielectric material located in apertures unexposed. Typical suitable radiation include UV light, X-rays and E-beam. Typically, the dosage is about 100 to about 2000 millijoules, and more typically about 200 to about 1000 millijoules. The particular intensity and duration can be determined by persons skilled in the art once aware of the present application without undue experimentation upon knowledge of the particular photosensitive dielectric material employed and the thickness of the layer on the circuit board or chip carrier.

In an alternative procedure according to the present invention, the photosensitive dielectric material is selectively exposed to radiation except for photosensitive material located within the vicinity of apertures, thereby leaving photosensitive dielectric material located in the apertures unexposed. The selective exposure can be carried out by providing a mask that blocks light from the vicinity of apertures whereby it is desired not to expose the photosensitive dielectric material. Typically, the mask will block the aperture as well as some area around the aperture such as extending about 3 to 7 mils around the aperture. It is also understood that it is contemplated that some of the apertures might be subjected to the exposure to the radiation while others of the apertures will remain unexposed. Also, according to this embodiment of the present invention, both sides of the circuit board are provided with the photosensitive dielectric material along with the desired mask during the exposure.

Moreover, according to the present invention, typically the apertures will be plated on the sidewalls with conductive metal such as copper.

After the exposure to the actinic radiation, the structure is subjected to baking in order to cure or harden the photosensitive dielectric material that has not been exposed to the actinic radiation. Typically, the baking will be at temperatures of about 80° C. to about 250° C., and more typically at about 100° C. to about 200° C. for about 30 to about 360 minutes, and more typically for about 120 to about 180 minutes of course, persons skilled in the art once aware of the present disclosure can readily determine desired temperatures and times to effect the curing of particular dielectric materials employed.

The exposed portions of the photosensitive dielectric material are developed by dissolution in a suitable solvent. Suitable solvents include aqueous and organic solvents.

If development is carried out with an organic solvent, the solvents used are those in which the epoxide resins used are soluble. This process step can be mechanized and can be carried out, for example, by means of a spray development device or continuous development device. Development merely by wiping over or by treatment with solvent vapor is also possible.

Suitable, organic solvents are polar solvents, especially polar, aprotic solvents, and can be used on their own or as mixtures composed of at least two solvents. The following are examples of suitable solvents: ethers, such as diethyl ether, dibutyl ether, tetrahydrofuran, dioxane, methyl ethylene glycol, dimethyl ethylene glycol, dimethyl diethylene glycol, diethyl diethylene glycol, dibutyl diethylene glycol or dimethyl triethylene glycol, halogenated hydrocarbons, such as methylene chloride, chloroform, carbon tetrachloride, 1,2-dichloroethane, 1,1,2-trichloroethane or 1,1,2,2-tetrachloroethane, carboxylic acid esters and lactones, such as propylene carbonate, ethyl acetate, methyl propionate, ethyl benzoate, ethyleneglycol acetate, 2-methoxyethyl acetate, γ-butyrolactone, γ-valerolactone and mevalolactone, sulfoxides, such as dimethyl sulfoxide or tetramethyl sulfoxide, sulfones, such as dimethyl sulfone, diethyl sulfone, trimethylene sulfone or tetramethylene sulfone, ketones, such as dimethyl ketone, methyl ethyl ketone, methyl isobutyl ketone and cyclohexanone, and substituted benzenes, such as chlorobenzene and nitrobenzene.

As discussed, the developing and post exposure baking can be carried out in any sequence, with the preferred sequence being baking followed by developing.

In the case of the first described process whereby the exposure is restricted to only the depth of the thickness on the substrate but leaves unexposed material located in the apertures, the development step results in a planarized surface suitable for subsequent circuitization. On the other hand, according to the second embodiment described above whereby selective exposure is conducted, there will remain a raised portion within the vicinity of apertures, commonly referred to as a "nub" which must be removed to achieve a planarized surface. This can be readily achieved by chemical-mechanical polishing. In any event, the final structure will be a planarized surface that is capable of being circuitized.

The following non-limiting examples are presented to further illustrate the present invention.

EXAMPLE 1

A mixture consisting of 8 gr of an epoxide cresol novolak, Araldite ECN-1280, 2 gr of talc, 0.08 g of ethyl violet, 0.24 g of Irgacure 261, 0.1 g of 2-methylimidazole, 5 gr of methyl ethyl ketone and 5 gr of propylene glycol monomethyl ether acetate is applied onto a 3 mil mylar film by means of a 20 wire doctor-blade. The film is then dried at 100° C. for about 10 minutes. The coated film is subsequently laminated onto a circuit board with the light sensitive material facing and contacting the circuit board. The dielectric material under pressure flows into the vias or apertures while the temperature is raised from room temperature to 150° C. After lamination the supporting film can be removed, the photosensitive layer is exposed to actinic radiation, baked, and subsequently developed with the unexposed areas remaining intact.

EXAMPLE 2

A mixture consisting of 11 gr of an epoxide bisphenol A diglycidyl ether (Epon-828), 10 gr of poly-p-vinylphenol (m.w. 1000), 0.44 g of Irgacure 261, 0.2 g of 2-methylimidazole, 5 gr of methyl ethyl ketone and 5 gr of propylene glycol monomethyl ether acetate is applied onto a 3 mil mylar film by means of a 20 wire doctor-blade. The film is then dried at 100° C. for about 10 minutes. The coated film is subsequently laminated onto a circuit board with the light sensitive material facing and contacting the circuit board. The dielectric material under pressure flows into the vias or apertures while the temperature is raised from room temperature to 150° C. After lamination the supporting film can be removed, the photosensitive layer is exposed to actinic radiation, baked, and subsequently developed with the unexposed areas remaining intact. The developer solution in this example is made of 37.35 g of sodium metasilicate pentahydrate and 2 gr of 2-ethoxyethanol in 1 liter of water.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A process for filling apertures in a circuit board or chip carrier with a cured photosensitive dielectric material, comprising the steps of:

filling the apertures in the circuit board or chip carrier and applying a layer having a thickness to the circuit board or chip carrier, with a positive photosensitive dielectric material;

exposing the photosensitive dielectric material to actinic radiation at an intensity and duration effective for causing the photosensitive dielectric material to be exposed to a depth of the thickness on the circuit board or chip carrier while leaving photosensitive dielectric material located in apertures unexposed to the actinic radiation;

baking to cure the unexposed photosensitive dielectric material located in the apertures;

developing the exposed material to remove it to the depth on the circuit board or chip carrier, thereby leaving behind cured photosensitive dielectric material located in the apertures.

2. The process of claim 1 wherein baking is carried out prior to developing.

3. The process of claim 1 wherein developing is carried out prior to baking.

4. The process of claim 1 wherein the baking only partially cures the unexposed material in the apertures prior to development and fully cures the unexposed material in the apertures after development.

5. The process of claim 1 wherein apertures are plated through-holes.

6. The process of claim 1 wherein the depth of the photosensitive dielectric material located on the circuit board or chip carrier is about 0.1 to about 5 mils.

7. The process of claim 1 wherein the depth of the photosensitive dielectric material located on the circuit board or chip carrier is about 0.5 to about 2.5 mils.

8. The process of claim 1 which comprises filling the apertures in the circuit board or chip carrier by providing a layer of the positive photosensitive dielectric material on a support layer and then laminating to the circuit board or chip carrier followed by removal of the support layer.

9. The process of claim 8 wherein the laminating is carried out at a pressure of about 50 to about 700 psi.

10. The process of claim 1 wherein the positive photosensitive dielectric material is flowable at a temperature of about 180° C. or lower.

11. The process of claim 10 wherein the positive photosensitive dielectric material has a viscosity of about 10,000 to about 1,000,000 cps.

12. The process of claim 10 wherein the positive photosensitive dielectric material has a viscosity of about 20,000 to about 500,000 cps.

13. The process of claim 1 wherein the positive photosensitive dielectric material is flowable at a temperature of about 50° C. to about 160° C.

14. The process of claim 1 wherein said baking is carried out at a temperature of about 80° C. to about 250° C.

15. The process of claim 1 which further includes providing circuitry on the circuit board or chip carrier.

16. The process of claim 1 wherein the depth of the photosensitive dielectric material located on the circuit board or chip carrier is about 0.1 to about 5 mils.

17. A process for filling apertures in a circuit board or chip carrier with a cured photosensitive dielectric material, comprising the steps of:

filling the apertures in the circuit board or chip carrier, and applying a layer having a thickness to the circuit board or chip carrier, with a positive photosensitive dielectric material;

selectively exposing the photosensitive dielectric material to radiation except for photosensitive dielectric material located within the vicinity of apertures, thereby leaving photosensitive dielectric material located in apertures unexposed;

baking to thereby cure photosensitive dielectric material that has not been exposed to the actinic radiation and developing the exposed photosensitive dielectric material thereby removing it while leaving behind cured dielectric photosensitive material in apertures.

18. The process of claim 17 wherein baking is carried out prior to developing.

19. The process of claim 17 wherein developing is carried out prior to baking.

20. The process of claim 17 wherein the baking only partially cures the unexposed material in the apertures prior to development and fully cures the unexposed material in the apertures after development.

21. The process of claim 17 which further comprises chemical-mechanical polishing of raised portions of cured photosensitive dielectric material located in the vicinity of apertures.

22. The process of claim 17 wherein apertures are plated through-holes.

23. The process of claim 17 wherein the depth of the photosensitive dielectric material located on the circuit board or chip carrier is about 0.5 to about 2.5 mils.

24. The process of claim 17 which comprises filling the apertures in the circuit board by providing a layer of the positive photosensitive dielectric material on a support and then laminating to the circuit board or chip carrier followed by removal of the support.

25. The process of claim 24 wherein the laminating is carried out at a pressure of about 50 to about 700 psi.

26. The process of claim 17 wherein the positive photosensitive dielectric material is flowable at a temperature of about 180° C. or lower.

27. The process of claim 26 wherein the positive photosensitive dielectric material has a viscosity of about 10,000 to about 1,000,000 cps.

28. The process of claim 26 wherein the positive photosensitive dielectric material has a viscosity of about 20,000 to about 500,000 cps.

29. The process of claim 17 wherein the positive photosensitive dielectric material is flowable at a temperature of about 50° C. to about 160° C.

30. The process of claim 17 which further includes providing circuitry on the circuit board or chip carrier.

31. The process of claim 17 wherein the baking is carried out at a temperature of about 80° C. to about 250° C.

32. The process of claim 17 which comprises leaving photosensitive dielectric material unexposed extending about 3 to about 7 mils around apertures.

* * * * *

UNITED STATES PATENT AND TRADEMARK OFFICE
CERTIFICATE OF CORRECTION

PATENT NO. : 6,225,031 B1
DATED : May 1, 2001
INVENTOR(S) : Bernd K. Appelt et al.

It is certified that error appears in the above-identified patent and that said Letters Patent is hereby corrected as shown below:

Column 7,
Line 41, "minutes of course" should be -- minutes. Of course --.
Line 55, there should not be a comma after "Suitable".

Signed and Sealed this

Eighth Day of January, 2002

Attest:

Attesting Officer

JAMES E. ROGAN
Director of the United States Patent and Trademark Office